United States Patent
Grimanis

(10) Patent No.: US 9,973,868 B2
(45) Date of Patent: May 15, 2018

(54) METHOD FOR ESTIMATING THE BATTERY LIFE OF BATTERY-POWERED AUDIO SYSTEMS BY MEANS OF AN AMPLITUDE MODULATED BROADBAND AUDIO SIGNAL

(71) Applicant: Tymphany Hk Limited, Wanchai (HK)

(72) Inventor: Dimitris Grimanis, Athens (GR)

(73) Assignee: TYMPHANY HK LTD., Wanchai (HK)

( * ) Notice: Subject to any disclaimer, the term of this patent is extended or adjusted under 35 U.S.C. 154(b) by 0 days. days.

(21) Appl. No.: 15/285,779

(22) Filed: Oct. 5, 2016

(65) Prior Publication Data
US 2018/0098165 A1    Apr. 5, 2018

(51) Int. Cl.
*H04R 29/00* (2006.01)
*H04R 3/04* (2006.01)

(52) U.S. Cl.
CPC ............ *H04R 29/001* (2013.01); *H04R 3/04* (2013.01)

(58) Field of Classification Search
CPC .. H02J 7/00; H02J 2007/0067; H04R 29/001; H04R 3/04
USPC .............. 381/56, 58, 124; 320/48, 127, 130; 324/426
See application file for complete search history.

(56) References Cited

U.S. PATENT DOCUMENTS

| | | | | |
|---|---|---|---|---|
| 6,127,617 A | * | 10/2000 | Suzuki | G10H 1/0091 84/625 |
| 2004/0227856 A1 | * | 11/2004 | Cooper | G06K 9/00335 348/512 |
| 2010/0282045 A1 | * | 11/2010 | Chen | G06F 17/30743 84/612 |
| 2012/0124470 A1 | * | 5/2012 | West | G06F 3/0488 715/702 |

\* cited by examiner

*Primary Examiner* — William A Jerez Lora
(74) *Attorney, Agent, or Firm* — Cantor Colburn LLP

(57) ABSTRACT

Aspects of present disclosure relate to a test signal generator, a method for estimating the battery life of battery-powered audio products by means of a test signal simulating effects of music, and a computer program product for generating a test signal simulating the effects of music. The method may include at least one of: extracting, by a test signal generation controller, one or more general characteristics of music, transmitting, by the test signal generation controller, the one or more general characteristics of music generated to a graphical user interface of a test signal generator, processing, by one or more music characteristics simulators, a white noise signal generated by a white noise generator of the test signal generator according to the one or more general characteristics of music to generate the test signal, and providing the formed test signal through a test signal output device of the test signal generator.

26 Claims, 5 Drawing Sheets

METHOD FOR ESTIMATING THE BATTERY LIFE OF BATTERY-POWERED AUDIO SYSTEMS BY MEANS OF AN AMPLITUDE MODULATED BROADBAND AUDIO SIGNAL

BACKGROUND

The present disclosure relates, generally, to battery life testing of battery-powered audio system, and more particularly to a method which utilises an amplitude regulated audio signal for estimating and assessing the battery life of such products.

One of the challenges in measuring the playtime duration of battery-equipped audio products is that there is no particular test signal that has the appropriate characteristics of music regarding its dynamic behaviour. A signal like that would not only present an energy distribution, within the typical audible spectrum, similar to the one found in music but would also simulate its dynamics.

A conventional method for estimating the playtime duration of battery-equipped audio products employs a preprocessed white noise signal, shaped in frequency according to the average of the power spectral density of music, as test signal. Nevertheless, in time-domain, white noise exhibits a long-term constant envelope, such characteristic do not well represent the dynamic behaviour of music and that is why this conventional method may provide inaccurate results. This inaccuracy relies upon the fact that when music is played on battery-equipped audio systems, with a relatively high volume, compressors and/or limiters are internally engaged to adjust or limit the output level and consequently, the energy consumed from the battery decreases. However, a white noise signal containing the same amount of energy as the high-volume music signal mentioned before, will unlikely engage any compressor or limiter, which leads the system to consume more energy.

Therefore, heretofore unaddressed needs still exist in the art to address the aforementioned deficiencies and inadequacies.

SUMMARY

In one aspect, the present disclosure relates to a method for estimating the battery life of battery-powered audio products. This method employs a preprocessed test signal which, not only presents the typical power spectral distribution found in music, but also simulates its dynamic behaviour by modulating, in a particular manner, its amplitude. In certain embodiments, the method may include: storing into an specified media player the prerecorded test signal, transmitting it to the audio product under evaluation either by using a physical or a wireless connection; reproduce the test signal through the product which is set into a specific mode, battery-wise and settings-wise; conduct the test until the product runs off battery and is switched off; and record the playtime duration.

In a preferred embodiment, the generation of the test signal may include: extracting, two or more general characteristics of music focused on describing its typical power spectral distribution and dynamic behaviour; converting the extracted general characteristics of music into frequency-domain and time-domain parameters; generating a filter function and an amplitude modulating signal according to the parameters produced in the previous step; processing a white noise signal, using the frequency-domain and time-domain products; and storing the resulting test signal into an storage system.

In another aspect, the present disclosure relates to a signal generator which generates the test signal with which the battery life of battery-powered audio products can be estimated with higher accuracy. In certain embodiments, the test signal generator includes: one or more music characteristic extractors, a graphical user interface, a white noise generator, one or more music characteristic simulators, a test signal output device, and a test signal generation controller. The one or more music characteristic extractors may extract one or more general characteristics of music from a specific music data base. The graphical user interface may receive one or more general characteristics of music. The white noise generator may be used to generate white noise. The one or more music characteristic simulators may process the white noise signal using the parameters extracted from music. The test signal output device may be used to provide the test signal generated. The test signal generation controller performs and manages operations of the test signal generator.

In yet another aspect, the present disclosure relates to a method for assessing the thermal behaviour of battery-powered audio product. This method employs a preprocessed test signal which, not only presents the typical power spectral distribution found in music, but also simulates its dynamic behaviour by modulating, in a particular manner, its amplitude. In certain embodiments, the method may include: storing into an specified media player the prerecorded test signal, transmitting it to the audio product under evaluation either by using a physical or a wireless connection; reproduce the test signal through the product which is set into a specific mode; conduct the test for a specified amount of time during which one or more thermal sensors provide information about the temperature at one or more points of the product. This information is registered and stored for analysis.

These and other aspects of the present disclosure will become apparent from the following description of the preferred embodiment taken in conjunction with the following drawings and their captions, although variations and modifications therein may be affected without departing from the spirit and scope of the novel concepts of the present disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Figure 1:
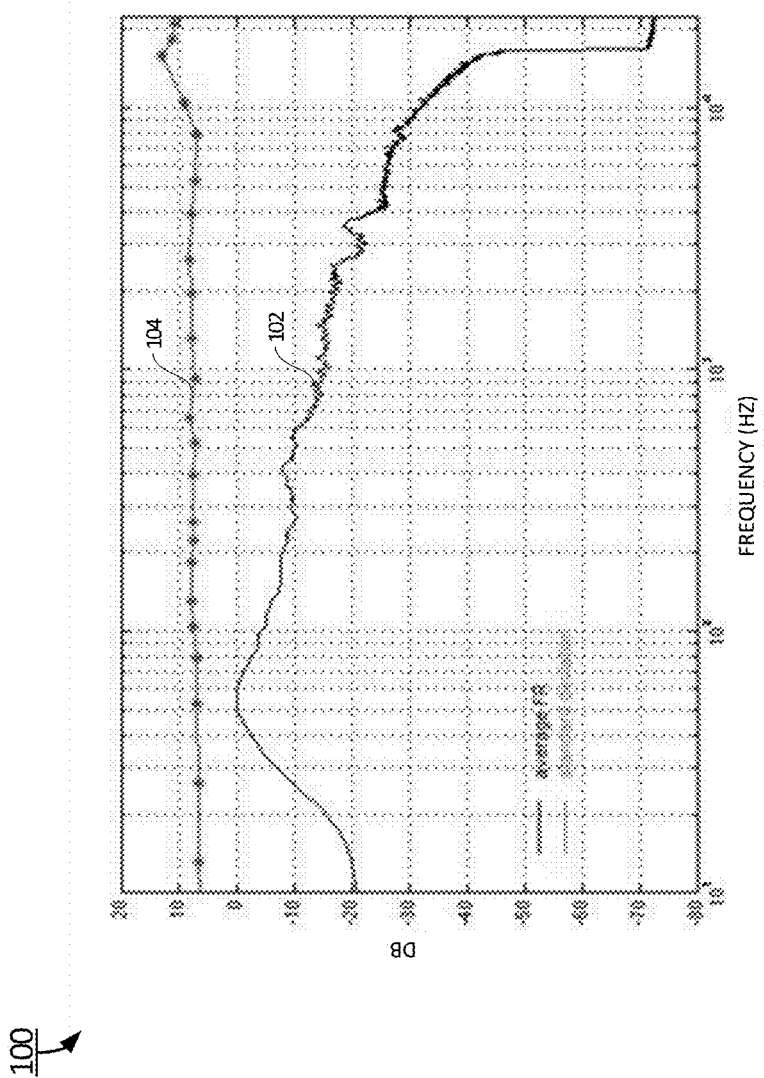
FIG. 1 depicts an average of power spectral distribution of a generic music collection according to certain embodiments of the present disclosure.

The present disclosure is more particularly described in the following examples that are intended as illustrative only because numerous modifications and variations therein will be apparent to those skilled in the art. Various embodiments of the invention are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the present disclosure, and in the specific context where each term is used. Certain terms that are used to describe the present disclosure are discussed below, or elsewhere in the specification, to provide additional guidance to the practitioner regarding the description of the present disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the present disclosure or of any exemplified term. Likewise, the present disclosure is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure will now be described more fully hereinafter with reference to the accompanying drawings FIGS. 1-5, in which certain exemplary embodiments of the present disclosure are shown. The present disclosure may, however, be embodied in many different forms and should not be construed as limited to the embodiments set forth herein; rather, these embodiments are provided so that this invention will be thorough and complete, and will fully convey the scope of the invention to those skilled in the art.

As described in the background, one of the challenges in measuring the playtime duration of battery-equipped audio products is that there is no particular test signal that has the appropriate characteristics of music. In order to effectively measure the playtime duration of battery-equipped audio products, a test signal should embody general characteristics of a large collection of music recordings. The general characteristics of music may include, but not limited to: frequency characteristics (pitch), intensity characteristics (loudness), tempo characteristics (pace or beats per minutes), and timbre characteristics (tone colour or tone quality). The more closely the test signal imitates general characteristics of music, the more accurate the playtime duration measurement will be. The test signal should carry the same amount of energy as well as the dynamics of that average musical content has.

In certain embodiments, in order to estimate the frequency and time characteristics of music, a large collection of music recordings is used. In one embodiment, the music collection includes over 2000 music tracks, containing various exemplary music genres, such as Alternative Music, Blues, Classical Music, Country Music, Dance Music, Easy Listening, Electronic Music, European Music, Hip Hop/Rap, Indie Pop, Inspirational/Gospel, Asian Pop, Jazz, Latin Music, New Age, Opera, Popular music, R&B/Soul, Reggae, various Rock music, World Music and etc.

FIG. 1 depicts frequency characteristics 100 of a music collection according to certain embodiments of the present disclosure. The frequency characteristics 100 of the music collection include an average power density distribution 102 of the music collection, and a standard deviation 104 of the average power density distribution 102 of the music collection. An almost constant standard deviation over the frequency range suggests that the average power density distribution 102 curve is indeed a reflection of the frequency characteristics of the music collection.

Figure 2:
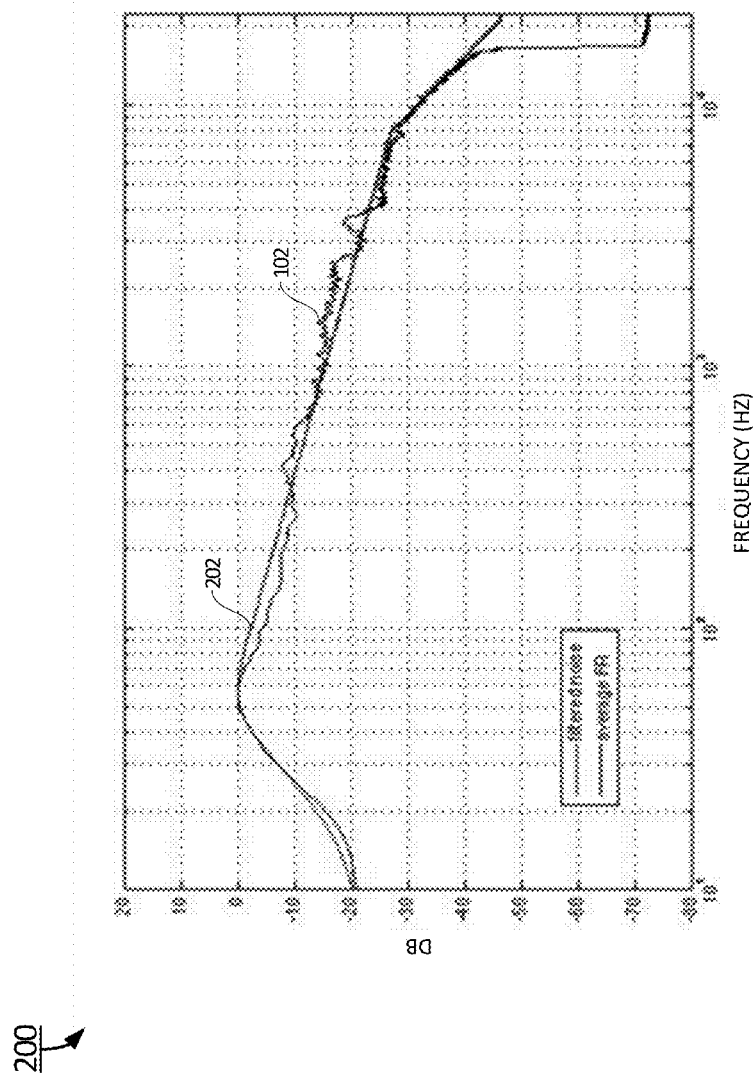
FIG. 2 depicts a filter function that simulates the power spectral distribution of a generic music collection according to certain embodiments of the present disclosure.

In order to generate the test signal having the typical power density distribution of music, a frequency characteristics simulator may generate a filter function according to the frequency characteristics extracted from the music collection and apply such filter to the white noise signal. FIG. 2 depicts the filter function 200 produced by a frequency characteristics simulator according to certain embodiments of the present disclosure. In an exemplary embodiment, the frequency characteristics simulator is designed to generate a filter function 202 as shown in FIG. 2, which mimics very closely the average power density distribution 102 of the music collection reproduced here in FIG. 2 from FIG. 1 as a comparison. When a white noise signal having an almost flat frequency curve is filtered by the frequency characteristics simulator, the output of the frequency characteristics simulator forms a test signal that closely imitates the general power density distribution of music.

In certain embodiments, root mean square (RMS) values of the normalised intensity levels are calculated and analysed to obtain the average RMS values of all the music recordings measured. In one embodiment, the average RMS value of all the music recordings is approximately 0.2 relative to 0 to 1 level scale. This intensity value may be used as a reference to determine/adjust the amplitude values of the test signal.

Figure 3:
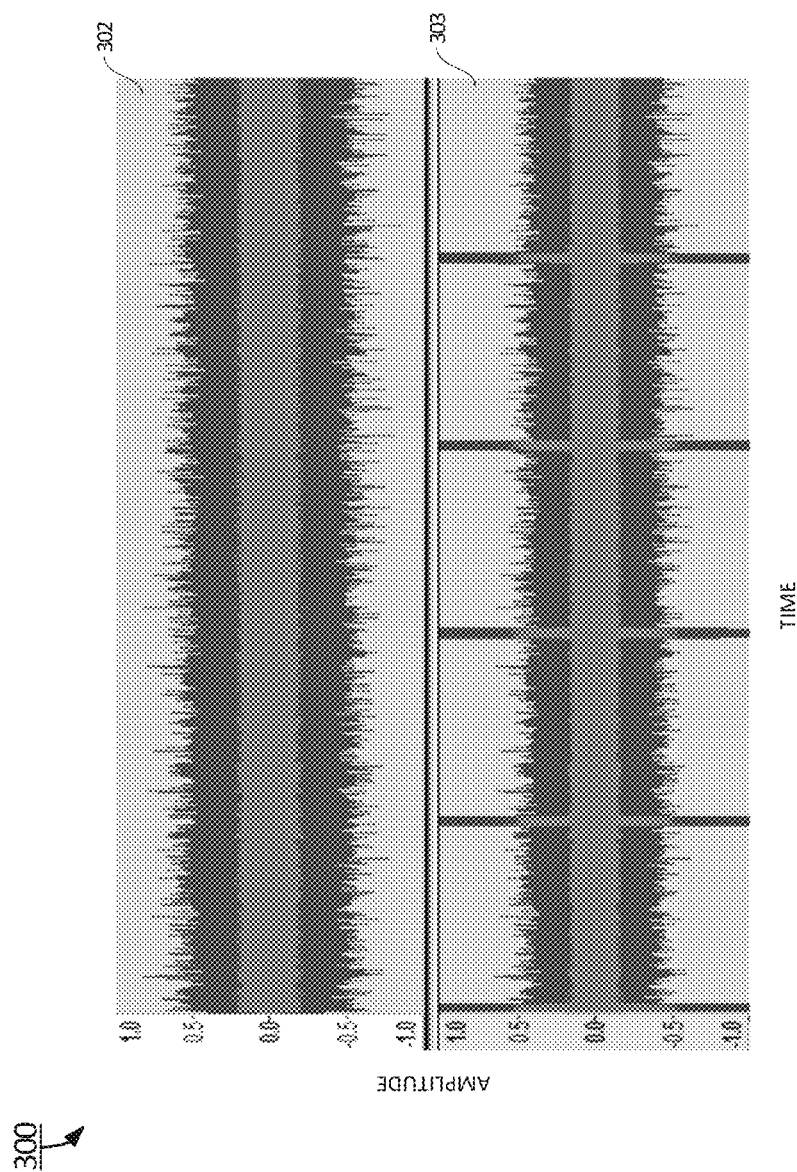
FIG. 3 depicts a white noise signal modulated in amplitude which simulates the dynamic behavior of music extracted from a generic music collection according to the certain embodiments of the present disclosure.

In order to generate a test signal which, apart from the frequency characteristics of music also has its dynamic characteristics, an amplitude characteristics simulator may generate a amplitude-modulating function according to the dynamic characteristics of music extracted from the music collection. FIG. 3 depicts a white noise signal 302 filtered by the frequency characteristics simulator, together with another white noise signal 303 filtered by the frequency characteristics simulator and processed by the amplitude characteristic simulator. Levels on both signals, 302 and 303, have been adjust so that they both present the same energy average. The second white noise signal 303, exhibits dynamic regions where the amplitude of the white noise covers the full dynamic range to ensure that compressors and/or limiters on the audio product are engaged during sound reproduction at a relative high volume.

In certain embodiments of the present disclosure, one of the music characteristics extracted from the music collection is related to the amount of energy saved by the compressors and/or limiters implemented in the battery-powered audio products when reproducing music tracks at relative high volumes. Also, in certain embodiments of the present disclosure this amount of energy saved is calculated and estimated to be around the 20% of the total energy of a music track. This parameter may be used as guidance to create the dynamic regions and can be adjusted depending on the initial requirements and methods for extracting it from the music collection as part of the music characteristics. In accordance with these embodiments, the dynamic regions exhibited in FIG. 3, are designed so that they put the compressors and/or limiters to work saving or cutting away approximately 20% of the energy of the whole signal.

Figure 4:
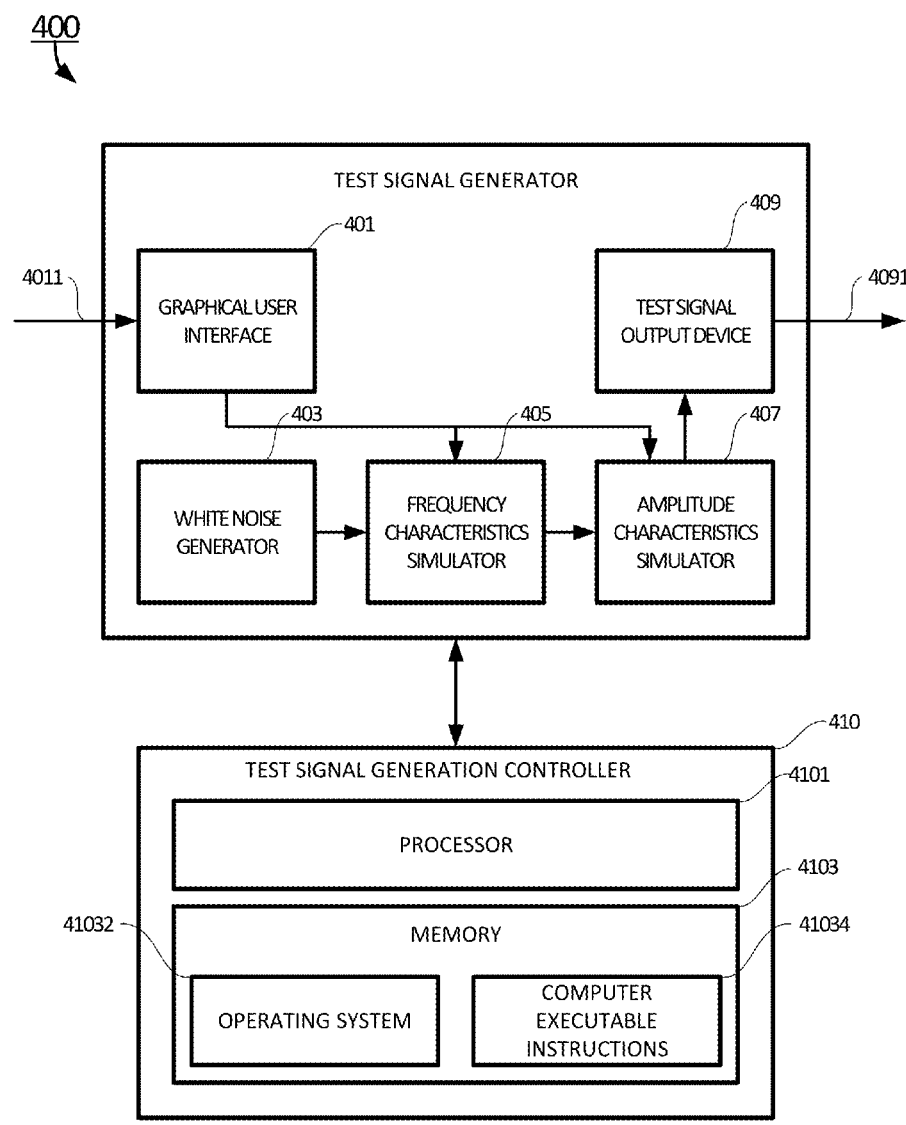
FIG. 4 is a block diagram of a test signal generator for generating a test signal which simulates the frequency and time characteristics of music according to certain embodiments of the present disclosure.

In one aspect, the present disclosure relates to a test signal generator 400. Referring now to FIG. 4, a block diagram of a test signal generator 400 for generating test signal simulating the effects of music is shown according to certain embodiments of the present disclosure. In certain embodiments, the test signal generator 400 includes: a graphical user interface 401, a white noise generator 403, one or more music characteristics simulators, a test signal output device 409, and a test signal generation controller 410.

The graphical user interface 401 may be used by a user to receive one or more general characteristics of music, to control the generation of the test signal according to the one or more general characteristics of music received, to make manual or automatic adjustment to the process of generation of the test signal.

The white noise generator 403 may be used to generate white noise as a base for the test signal before going through a series of signal conditioning process. In one embodiment, the white noise generator 403 may be a hardware analog white noise generator. In another embodiment, the white noise generator 403 may be a computer algorithm to generate white noise in digital form.

In certain embodiments, the general characteristics of music may include: frequency characteristics, intensity characteristics, tempo characteristics, and timbre characteristics. In order to simulate the music in the music collection, one or more music characteristics simulators may be used to process the white noise generated by the white noise generator 403 according to the one or more general characteristics of music received to generate a test signal.

In certain embodiments, a frequency characteristics simulator 405 may be used to simulate the frequency characteristics. The frequency characteristics simulator 405 may be designed to have the frequency characteristics 202 as shown in FIG. 2.

In certain embodiments, an amplitude characteristics simulator 407 may be used to simulate the amplitude characteristics introducing dynamic regions into the white noise signal. Based on the measurements taken from the collection of music, the intensity characteristics of music have an overall RMS value of approximately 0.2 for normalised music recording. Therefore, the amount of energy for a white noise with an overall intensity value in RMS of approximately 0.2 may be used as a reference. When the amplitude characteristics simulator 407 introduces the dynamic regions it also may decrease the amplitude of the steady white noise regions so that the total amount of energy of the test signal is kept the same. In an exemplary embodiment depicted in FIG. 3, both signals have the same overall amount of energy, however the upper white noise signal 302, having long-term constant amplitude, presents a higher average intensity level than the constant amplitude regions of the dynamic white noise signal 303, whose amplitude has been decreased so that the energy saved on doing so can be relocated on the dynamic regions. The amplitude characteristics simulator may adjust the intensity level of the white noise signal and generate the dynamic regions accordingly so that the total amount of the energy of the test signal mimics the energy characteristics of music.

In addition to the frequency characteristics simulator 405, and the amplitude characteristics simulator 407, other simulators may also be used to improve the simulation of music signal. In certain embodiments, tempo characteristics and/or timbre characteristics may be extracted from the music collection similar to the approach to extract the frequency characteristics and the intensity characteristics. These tempo characteristics and timbre characteristics may be used as basis for a tempo characteristics simulator, and/or a timbre characteristics simulator.

In one embodiment, the frequency characteristics simulator 405, the amplitude characteristics simulator 407, the tempo characteristics simulator, and the timbre characteristics simulator may be used in a serial form, but not necessarily in that order. The white noise signal generated by the white noise generator 403 are conditioned through at least one of the frequency characteristics simulator 405, the amplitude characteristics simulator 407, the tempo characteristics simulator, and the timbre characteristics simulator to generate the test signal.

In certain embodiments, the test signal generated through at least one of the frequency characteristics simulator 405, the amplitude characteristics simulator 407, the tempo characteristics simulator, and the timbre characteristics simulator is provided to an device through the test signal output device 409.

In certain embodiments, the test signal generation controller 410 may include a non-transitory computer readable memory 4103 and a processor 4101. The non-transitory computer readable memory 4103 stores an operating system 41032, and computer executable instructions 41034. When the computer executable instructions 41034 are executed by the processor 4101, the computer executable instructions 41034 cause the processor 4101 to perform: extracting, by the test signal generation controller 410, the one or more general characteristics of music, transmitting, by the test signal generation controller 410, the one or more general characteristics of music extracted to the graphical user interface 401 of the test signal generator 400, generating, by the white noise generator 403 of the test signal generator 400, a white noise signal, processing, by the one or more music characteristics simulators, the white noise signal generated according to the one or more general characteristics of music to generate the test signal, and providing, by the test signal output device 409 of the test signal generator 400, the generated test signal.

Figure 5:
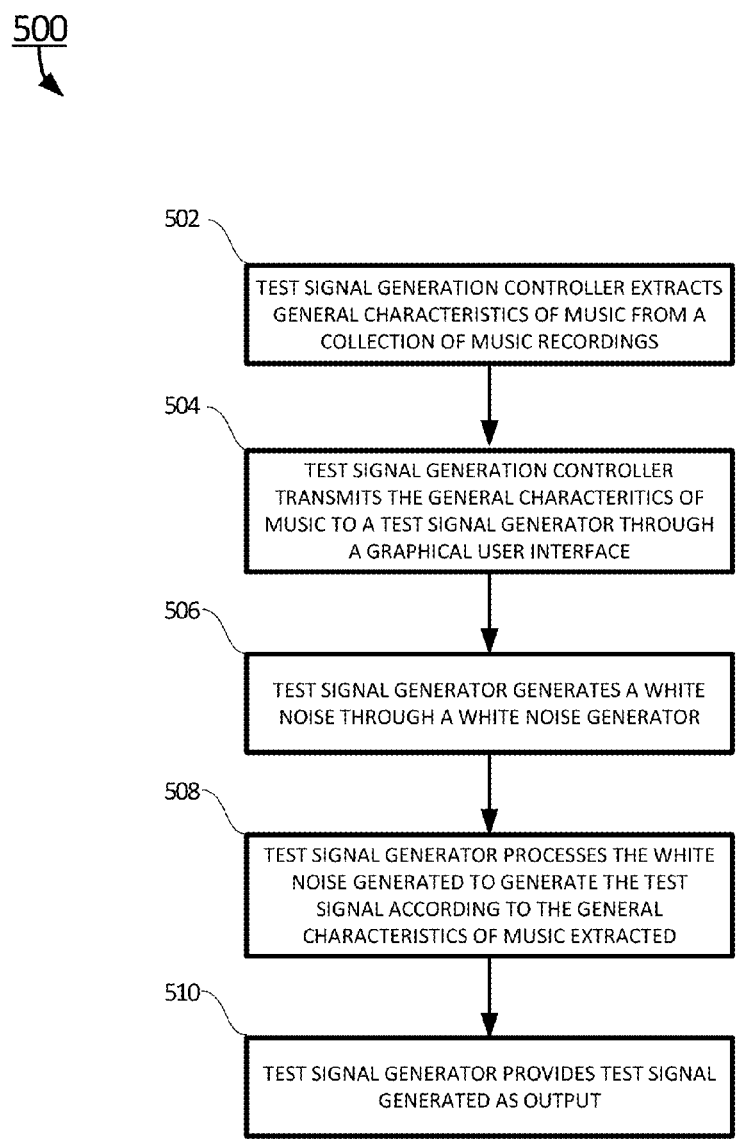
FIG. 5 is a flowchart showing a method for estimating the battery life of battery-powered audio systems according to certain embodiments of the present disclosure.

In another aspect, the present disclosure relates to a method for estimating the battery life of battery-powered audio products by means of a test signal simulating the characteristics of music according to its frequency and dynamic behaviour. Referring now to FIG. 5, a flowchart showing a method 500 for estimating the battery life of battery-powered audio products is shown according to certain embodiments of the present disclosure.

At block 502, a test signal generation controller 410 extracts one or more general characteristics of music from a collection of music recordings. In certain embodiments, the collection of music recordings may be over 2000 music recordings of a wide variety of music genres. In order to simulate generic music, the music genres may include Alternative Music, Blues, Classical Music, Country Music, Dance Music, Easy Listening, Electronic Music, European Music, Hip Hop/Rap, Indie Pop, Inspirational/Gospel, Asian Pop, Jazz, Latin Music, New Age, Opera, Popular music, R&B/Soul, Reggae, various Rock music, World Music and etc.

In certain embodiments, the one or more music characteristics may include frequency characteristics, intensity characteristics, tempo characteristics, and timbre characteristics.

At block 504, the test signal generation controller 410 may transmit the one or more general characteristics of music generated to a graphical user interface 401 of a test signal generator 400. The one or more general characteristics of music are the basis for generate the test signal.

At block 506, a white noise generator 403 of the test signal generator 400 generates a white noise signal as a base for the test signal. In one embodiment, the white noise generator 403 is a hardware white noise generator to generate the white noise signal in an analog form. In another embodiment, the white noise generator 403 is a white noise generation module to generate the white noise signal in a digital form.

At block 508, one or more music characteristics simulators process the white noise signal generated according to the one or more general characteristics of music extracted to generate the test signal. In certain embodiments, the one or more music characteristics simulators may include frequency characteristics simulator, amplitude characteristics simulator, tempo characteristics simulator, and timbre characteristics simulator.

At block 510, a test signal output device 409 of the test signal generator 400 provides the generated test signal as output.

In one embodiment, the output generated by the signal generator 400 is stored digitally for estimating the battery life of battery-powered audio products. When performing the battery life test, the test signal is transmitted by a music player, using physical or wireless transmission supports, to the product which is set in a specify reproduction mode which may imply the battery fully charged and a determined output volume. The product plays the test signal until the battery is discharged and the system switches off. The playtime is recorded and stored for further analysis.

In yet another aspect, the present disclosure relates to a computer program product. In certain embodiments, the computer program product may be operable on a processor 4101 of a test signal generation controller 410. The test signal generation controller 410 may include a non-transitory computer readable memory 4103 storing computer executable instructions 41034 and a processor 4101. When executed by the processor 4101, the computer executable instructions 41034 cause the processor 4101 to perform: extracting, by a test signal generation controller 410, one or more general characteristics of music, transmitting, by the test signal generation controller 410, the one or more general characteristics of music generated to a graphical user interface 401 of a test signal generator 400, generating, by a white noise generator 403 of the test signal generator 400, a white noise signal, processing, by one or more music characteristics simulators, the white noise signal generated according to the one or more general characteristics of music to generate the test signal, and providing, by a test signal output device 409 of the test signal generator 400, the generated test signal.

Aspects of the present disclosure are described herein with reference to flowchart illustrations and/or block diagrams of methods. It will be understood that each block of the flowchart illustrations and/or block diagrams, and combinations of blocks in the flowchart illustrations and/or block diagrams, can be implemented by computer readable program instructions or hardware.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A test signal generator comprising:
a test signal generation controller configured to transmit a plurality of general characteristics of music and perform operations of the test signal generator;
a white noise generator configured to generate white noise;
a plurality of music characteristics simulators configured to process the white noise generated according to the plurality of general characteristics of music received to generate a test signal;
a test signal output device configured to provide the test signal generated.

2. The test signal generator of claim 1, wherein the test signal generation controller comprises:

a memory storing an operating system, and computer executable instructions; and a processor configured to execute the computer executable instructions, wherein when executed by the processor, the computer executable instructions cause the processor to perform:

generating, by the test signal generation controller, the plurality of general characteristics of music;

transmitting, by the test signal generation controller, the plurality of general characteristics of music generated to the test signal generator;

processing, by the plurality of music characteristics simulators, a white noise signal generated by the white noise generator according to the plurality of general characteristics of music to form the test signal; and providing the test signal formed through the test signal output device of the test signal generator.

3. The test signal generator of claim 2, wherein generating the plurality of general characteristics of music comprises generating the plurality of general characteristics of music based on a collection of music.

4. The test signal generator of claim 3, wherein the plurality of general characteristics of music comprises:
frequency characteristics;
intensity characteristics;
tempo characteristics; and
timbre characteristics.

5. The test signal generator of claim 4, wherein generating the intensity characteristics comprises:
normalizing intensity levels of the collection of music to 1 to obtain an average root mean square (RMS) value of all of the collection of music.

6. The test signal generator of claim 5, wherein the average root mean square value of the collection of music is approximately 0.2 relative to a 0 to 1 level.

7. The test signal generator of claim 4, wherein the plurality of music characteristics simulators comprises at least one of:
a frequency characteristics simulator configured to process an input signal according to the frequency characteristics;
an amplitude characteristics simulator configured to process an input signal according to the intensity characteristics;
a tempo characteristics simulator configured to process an input signal according to the tempo characteristics; and
a timbre characteristics simulator configured to process an input signal according to the timbre characteristics.

8. The test signal of claim 7, wherein the amplitude characteristics simulator regulates the amplitude of the test signal so that it includes dynamic regions whose amplitude corresponds to a full dynamic range of an audio device.

9. The test signal of claim 8, wherein the dynamic regions generated by the amplitude characteristics generator contain, approximately, 20% of a total energy of the test signal.

10. A method for estimating a battery life of peered-battery audio products by means of a test signal simulating one or more characteristics of music, comprising:
generating, by a test signal generation controller, a plurality of general characteristics of music;
transmitting, by the test signal generation controller, the plurality of general characteristics of music generated to a test signal generator;
processing, by a plurality of music characteristics simulators, a white noise signal generated by a white noise generator of the test signal generator according to the plurality of general characteristics of music to form the test signal;
providing the formed test signal through a test signal output device of the test signal generator;
reproducing the test signal by an audio product under test until the battery is fully discharged; and
recording a playtime of the product.

11. The method of claim 10, wherein generating the plurality of general characteristics of music comprises generating the plurality of general characteristics of music based on a collection of music.

12. The method of claim 11, wherein the plurality of general characteristics of music comprises:
frequency characteristics;
intensity characteristics;
tempo characteristics; and
timbre characteristics.

13. The method of claim 12, wherein generating the intensity characteristics comprises:
normalizing intensity levels of the collection of music to 1 to obtain an average root mean square (RMS) value of all of the collection of music.

14. The method of claim 13, wherein the average root mean square value of the collection of music is approximately 0.2 relative to a 0 to 1 level.

15. The method of claim 12, wherein the plurality of music characteristics simulators comprises at least one of:
a frequency characteristics simulator configured to process an input signal according to the frequency characteristics;
an amplitude characteristics simulator configured to process an input signal according to the intensity characteristics;
a tempo characteristics simulator configured to process an input signal according to the tempo characteristics; and
a timbre characteristics simulator configured to process an input signal according to the timbre characteristics.

16. The method of claim 10, wherein the test signal generator comprises:
the test signal generator configured to receive a plurality of general characteristics of music;
the white noise generator configured to generate white noise;
the plurality of music characteristics simulators configured to process the white noise generated according to the plurality of general characteristics of music received to generate a test signal;
the test signal output device configured to provide the test signal generated; and
a test signal generation controller configured to perform operations of the test signal generator.

17. The test signal of claim 16, wherein the amplitude characteristics simulator regulates the amplitude of the test signal so that it includes dynamic regions whose amplitude corresponds to a full dynamic range of an audio device.

18. The test signal of claim 17, wherein the dynamic regions generated by the amplitude characteristics generator contain, approximately, 20% of a total energy of the test signal.

19. A computer program product operable on a processor of a test signal generation controller comprising a non-transitory computer readable memory having computer executable instructions embodied therewith, wherein when executed by the processor, the computer executable instructions cause the processor to perform:

generating, by a test signal generation controller, a plurality of general characteristics of music;

transmitting, by the test signal generation controller, the plurality of general characteristics of music generated to a test signal generator;

generating, a white noise signal;

processing, by a plurality of music characteristics simulators, a white noise signal generated by a white noise generator of the test signal generator according to the plurality of general characteristics of music to form the test signal; and providing the formed test signal through a test signal output device of the test signal generator.

20. The computer program product of claim 19, wherein generating the plurality of general characteristics of music comprises generating the plurality of general characteristics of music based on a collection of music.

21. The computer program product of claim 20, wherein the plurality of general characteristics of music comprises:
frequency characteristics;
intensity characteristics;
tempo characteristics; and
timbre characteristics.

22. The computer program product of claim 21, wherein generating the intensity characteristics comprises:
normalizing intensity levels of the collection of music to 1 to obtain an average root mean square (RMS) value of all of the collection of music.

23. The computer program product of claim 22, wherein the average root mean square value of the collection of music is approximately 0.2 relative to a 0 to 1 level.

24. The computer program product of claim 19, wherein the plurality of music characteristics simulators comprises at least one of:
a frequency characteristics simulator configured to process an input signal according to the frequency characteristics;
an intensity characteristics simulator configured to process an input signal according to the intensity characteristics;
a tempo characteristics simulator configured to process an input signal according to the tempo characteristics; and
a timbre characteristics simulator configured to process an input signal according to the timbre characteristics.

25. The test signal of claim 24, wherein the amplitude characteristics simulator regulates the amplitude of the test signal so that it includes dynamic regions whose amplitude corresponds to a full dynamic range of an audio device.

26. The test signal of claim 25, wherein the dynamic regions generated by the amplitude characteristics generator contain, approximately, 20% of a total energy of the test signal.

* * * * *